United States Patent
Halevy et al.

(10) Patent No.: US 8,756,265 B1
(45) Date of Patent: Jun. 17, 2014

(54) AUDIO FILTER BANK DESIGN

(75) Inventors: Shalom Halevy, San Diego, CA (US); Douglas A. Moore, Alameda, CA (US)

(73) Assignee: The Intellisis Corporation, San Diego, CA (US)

( * ) Notice: Subject to any disclaimer, the term of this patent is extended or adjusted under 35 U.S.C. 154(b) by 369 days.

(21) Appl. No.: 13/097,633

(22) Filed: Apr. 29, 2011

Related U.S. Application Data

(60) Provisional application No. 61/330,042, filed on Apr. 30, 2010.

(51) Int. Cl.
*G06F 17/10* (2006.01)

(52) U.S. Cl.
USPC .......................................................... 708/300

(58) Field of Classification Search
None
See application file for complete search history.

(56) References Cited

U.S. PATENT DOCUMENTS

| | | | |
|---|---|---|---|
| 7,974,714 B2 * | 7/2011 | Hoffberg | 700/94 |
| 2002/0136277 A1 * | 9/2002 | Reed et al. | 375/148 |
| 2009/0177247 A1 * | 7/2009 | Neal et al. | 607/57 |
| 2011/0270790 A1 | 11/2011 | Moore | 706/44 |

OTHER PUBLICATIONS

Smith, Zachary M. et al., "Chimaeric Sounds Reveal Dichotomies in Auditory Perception", *Nature*, vol. 416, No. 6876, Mar. 7, 2002, pp. 87-90.

\* cited by examiner

*Primary Examiner* — David H Malzahn
(74) *Attorney, Agent, or Firm* — Pillsbury Winthrop Shaw Pittman LLP

(57) ABSTRACT

A system, method, and computer program product are provided for reducing ripple in a filter bank. For a given fixed number of linearly-spaced filters in the filter bank, a monotonically increasing function for a Q-factor is specified for the filter bank. Adjustments to each filter's Q-factor based on the Q-factor function are made in order to produce a nearly constant filter bank ripple throughout the filter bank's frequency response range.

14 Claims, 11 Drawing Sheets

500

AUDIO FILTER BANK DESIGN

CROSS-REFERENCE TO RELATED APPLICATION

The present application claims the benefit of U.S. Provisional Application No. 61/330,042, filed Apr. 30, 2010, entitled "Audio Filter Bank Design", which is incorporated herein by reference in its entirety.

BACKGROUND OF INVENTION

1. Field of the Invention

The present invention relates generally to filters and, in particular, to improving responsiveness of a filter bank.

2. Description of the Background Art

Audio signal analysis typically uses a time-frequency analysis to extract a set of useful features or parameters. This can be accomplished through the use of a filter bank (i.e., an array) of band-pass filters to provide instantaneous spectra energy and phase measurements of an input signal. A digital filter bank is employed to separate the input signal into several components, each corresponding to a frequency sub-band filtered through by a corresponding band-pass filter of the filter bank. Such filter extraction is commonly used in a number of fields, including speech, radar, and sonar signal processing.

In an ideal (i.e., theoretical) filter bank, each filter has a boxcar frequency response, meaning that the filter's response is perfectly flat throughout its responsive range, with the response tapering off with infinite slope at the edge frequency or frequencies. Such an ideal filter bank is not physically realizable because the response to a step function input at a time t=0 would have to start prior to time t=0.

Accordingly, what is desired is a realizable filter bank that improves responsiveness across a particular frequency range.

SUMMARY OF INVENTION

Embodiments of the invention include a method comprising specifying a fixed number of linearly-spaced filters in a filter bank, defining a monotonically increasing Q-factor function for the filter bank, and applying a corresponding Q-factor adjustment to each filter of the filter bank based on the Q-factor function.

Embodiments of the invention additionally include an article of manufacture including a computer-readable storage medium having stored thereon computer-executable instructions, execution of which, by one or more computing devices, causes the computing devices to perform operations comprising specifying a fixed number of linearly-spaced filters in a filter bank, defining a monotonically increasing Q-factor function for the filter bank, and applying a corresponding Q-factor adjustment to a filter of the filter bank based on the Q-factor function.

Embodiments of the invention further include a system comprising a filter bank comprising a fixed number of linearly-spaced filters in a filter bank, a defining module configured to define a monotonically increasing Q-factor function for the filter bank, and a Q-factor adjustment module configured to apply a corresponding Q-factor adjustment to a filter of the filter bank based on the Q-factor function.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the relevant art to make and use the invention.

Figure 1:
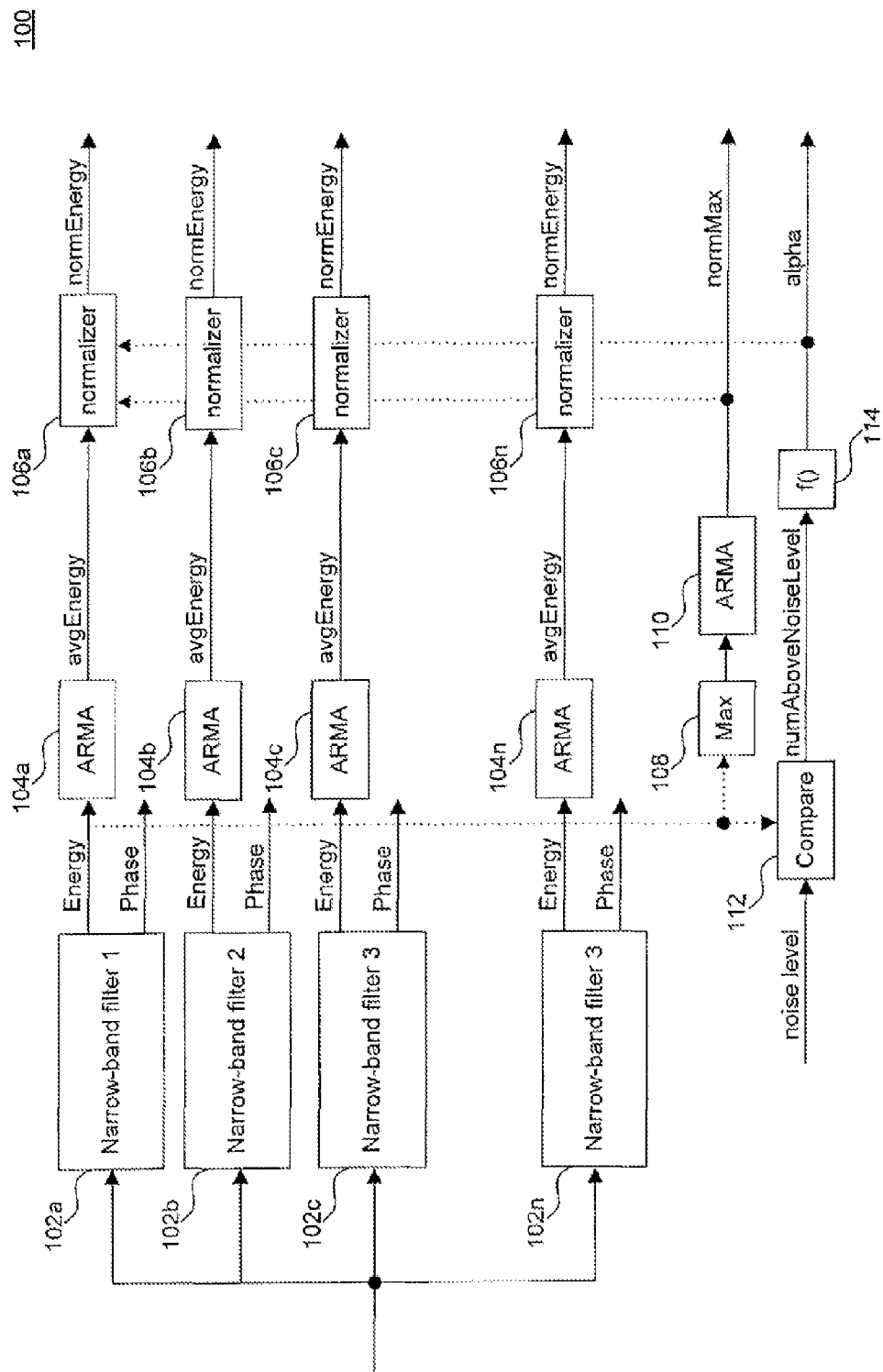
FIG. 1 is an exemplary filter bank configuration, in accordance with an embodiment of the present invention.

The present invention will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

I. Introduction

The following detailed description of the present invention refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

As used herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Further, it would be apparent to one of skill in the art that the present invention, as described below, can be implemented in many different embodiments of software, hardware, firmware, and/or the entities illustrated in the figures. Any actual software code with the specialized control of hardware to implement the present invention is not limiting of the present invention. Thus, the operational behavior of the present invention will be described with the understanding that modifications and variations of the embodiments are possible, and within the scope and spirit of the present invention.

FIG. 1 is an exemplary filter bank configuration 100, in accordance with an embodiment of the present invention. The filter bank comprises a number of filters, such as narrow-band filters 102a-102n (collectively "filters 102" or "filter bank 102"), in accordance with an embodiment of the present invention. In accordance with an embodiment of the present invention, filters 102 accept speech input, such as a frequency range of approximately 300 Hz to 3400 Hz for telephony communications. One skilled in the relevant arts will recognize that any frequency range may be used, and usage in telephony speech processing is provided by way of example, and not limitation.

The cochlea, a component of the human inner ear, performs filter bank-based frequency analysis on audio signals, including speech, in order to extract relevant features. In accordance with an embodiment of the present invention, filter bank configuration 100 is structured to mimic the performance of the cochlea, and therefore acts as a "digital cochlea" or "electronic cochlea". Using filters 102, an input signal, such as speech, can be processed in order to extract relevant features in a similar manner to the human cochlea, in accordance with a further embodiment of the present invention.

Each of filters 102 is configured to output an instantaneous energy, in accordance with an embodiment of the present invention. The instantaneous energy is averaged using an autoregressive moving average ("ARMA") 104a-104n (collectively "ARMA 104") to produce an average energy, in accordance with a further embodiment of the present invention. As will be understood by one skilled in the relevant arts, in an exemplary non-limiting embodiment, an ARMA 104 is comprised of an autoregressive ("AR") and a moving average ("MA") modeling components. The AR model component is a linear regression of a current value against one or more prior values, whereas the MA model component is a linear regression of the current value against white noise or random shocks of one or more prior values, in accordance with an embodiment of the present invention. The final output of each filter is then normalized by normalizers 106a-106n (collectively "normalizers 106") to provide a normalized energy output, in accordance with an additional embodiment of the present invention.

In accordance with an embodiment of the present invention, sensitivity and normalization at individual frequencies are user-modifiable. This allows the filter bank 102 to mimic or model biologically plausible hearing sensitivity curves, in accordance with a further embodiment of the present invention.

The normalized outputs are such that they are normalized to a range used by computations performed in common to all of the energy outputs, in accordance with an embodiment of the present invention. This ensures some level of consistency in the application of processing algorithms to quiet audio signals and loud audio signals, by way of example and not limitation. For example, normalized energy outputs may be guaranteed to fall in a range between −1 and 1, inclusive, so that all computations acting on the normalized outputs can be written to expect data in this range.

The group of normalized energy outputs is collectively termed a feature vector, the feature vector having a dimensionality corresponding to the number of filters, in accordance with an embodiment of the present invention. As a result, the values for each dimension of the feature vector (commonly termed a "bin") corresponds to the normalized instantaneous energy response within a particular frequency range.

Additional elements found in exemplary filter bank configuration 100 include a maximum instantaneous energy computation module 108, the output of which is subjected to an additional ARMA module 110, in accordance with an embodiment of the present invention. A noise level comparator 112 is used to determine a quantity of filters having an instantaneous energy above a specified noise level, the result of which is used to compute alpha values that, in conjunction with the ARMA-averaged maximum instantaneous energy from ARMA module 110, and each filter's average energy provided by ARMA 104, are used to adjust the normalized energy output, in accordance with a further embodiment of the present invention. This behavior is discussed in additional detail below.

As noted above, one skilled in the relevant arts will appreciate that the implementation of filter bank configuration 100, or any combination of components thereof, may be implemented in a combination of hardware and/or software components, including (but not limited to) through the use of discrete components, digital signal processing ("DSP") processors, or general purpose processors ("GPPs"), in accordance with an embodiment of the present invention.

Currently used spectral decomposition applications use a fast Fourier transform ("FFT")-based short time Fourier transform ("STFT") for time-frequency decomposition, and therefore do not achieve the non-uniform time and frequency resolution provided by the human cochlea. These applications, which take advantage of the computational efficiency of FFTs as a uniform filter bank, require a scale transform from the linear frequency scale given by the FFT to a highly non-linear frequency scale used in auditory models, resulting in a less efficient product of time and frequency resolution. Unlike STFT, however, the electronic cochlea described herein through the use of filter bank configuration 100 produces an instantaneous (or near-instantaneous) time-frequency estimate after each data sample, in accordance with an embodiment of the present invention.

II. Effects of Linear Frequency Spacing

Figure 2:
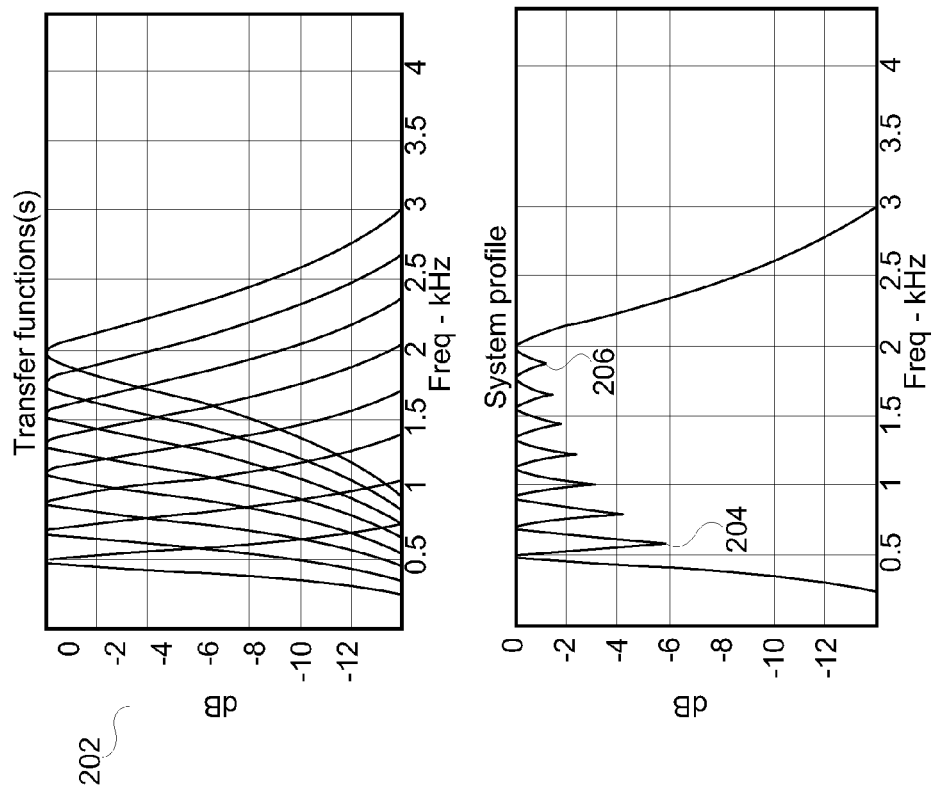
FIG. 2 illustrates the frequency response of a filter bank having linearly-spaced filters over a frequency range and a constant Q-factor, in accordance with an embodiment of the present invention.

FIG. 2 illustrates the frequency response 200 of a filter bank, such as filter bank 102 of FIG. 1, having linearly-spaced filters over a frequency range and a constant Q-factor, in accordance with an embodiment of the present invention. Graph 202 illustrates overlapping frequency responses of the individual filters comprising the filter bank. A separate graph illustrates the overall frequency response of the filter bank, showing significant losses in the frequency response at lower frequencies 204, and a smaller loss at higher frequencies 206.

Each sub-band filter comprising the filter bank has a constant Q-factor, as noted above. This Q-factor is a dimensionless parameter that is proportional to the ratio of the filter's center frequency and the filter's 3 dB bandwidth, in accordance with an embodiment of the present invention. One skilled in the relevant arts will recognize that reference to the Q-factor throughout this specification can be used to indicate frequency range and drop-off of a filter using other characteristics, and is not limited to this exemplary set of characteristics.

Using this exemplary construct of the Q-factor, a higher Q indicates smaller relative bandwidth for a given filter. Most filter banks, such as the filter bank producing the frequency response 200 of FIG. 2, use a constant Q-factor for all filters, such that the bandwidth of high frequency filters is higher, resulting in a large cross-over loss 204 at low frequencies and a smaller cross-over loss 206 at higher frequencies.

This cross-over loss phenomenon has many names, such as "resolution bias error", "scalloping effect", or the "picket fence" effect. This picket fencing loss results in the apparent attenuation of a measured value for any frequency component falling between adjacent filter bank sub-bands. For example, in the filter bank producing frequency response 200 of FIG. 2, any frequency component of the original signal occurring at approximately 600 Hz would be severely attenuated, and may be lost.

An ideal response for the filter bank 102 has the superposition of the individual sub-band frequency responses result in a boxcar response. Accordingly, the closer a realizable filter bank can approach this ideal solution, the better it can response to any signal frequency within its frequency response range without significant attenuation.

The picket fence effect can be characterized by a measure known as "ripple", which is the allowed variation in magnitude response in the analysis band for a filter bank. As seen in FIG. 2, the frequency response 200 has a significant ripple, from a −6 dB attenuation at approximately 600 Hz, to a smaller attenuation of approximately −1 dB at around 1.8 Khz.

Figure 3:
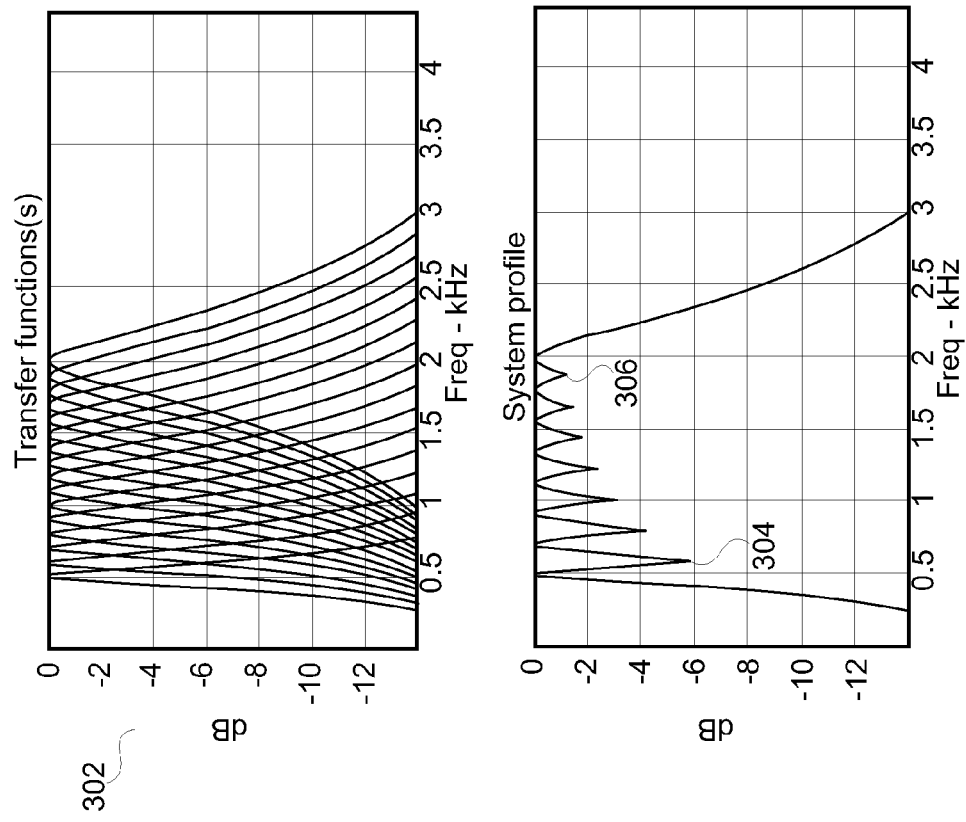
FIG. 3 illustrates a proposed solution to reduce ripple, in accordance with an embodiment of the present invention.

One attempt to reduce ripple is shown in frequency response 300 of FIG. 3, in accordance with an embodiment of the present invention. Graph 302 (a "Bode plot") illustrates the frequency response of a filter bank 102 having the same frequency response range as that producing graph 202 of FIG. 2, but comprised of an increased number of sub-bands, and therefore individual filters comprising the filter bank 102, in accordance with a further embodiment of the present invention. As is shown in frequency response 300, the overall attenuation of the frequency response range from 0.5 kHz to 2 kHz has decreased by using sixteen linearly spaced sub-band filters instead of eight, as in FIG. 2.

However, the ripple still remains inconsistent throughout the frequency response range, showing approximately a −2 dB attenuation approaching 0.5 kHz, and a very small attenuation approaching 2. Khz. Notably, however, the frequency range is very small to begin with, and the improvement enjoyed by the addition of filters does not scale well. Increasing the number of sub-bands increases the computational load, stressing processing, memory, and power requirements.

Figure 4:
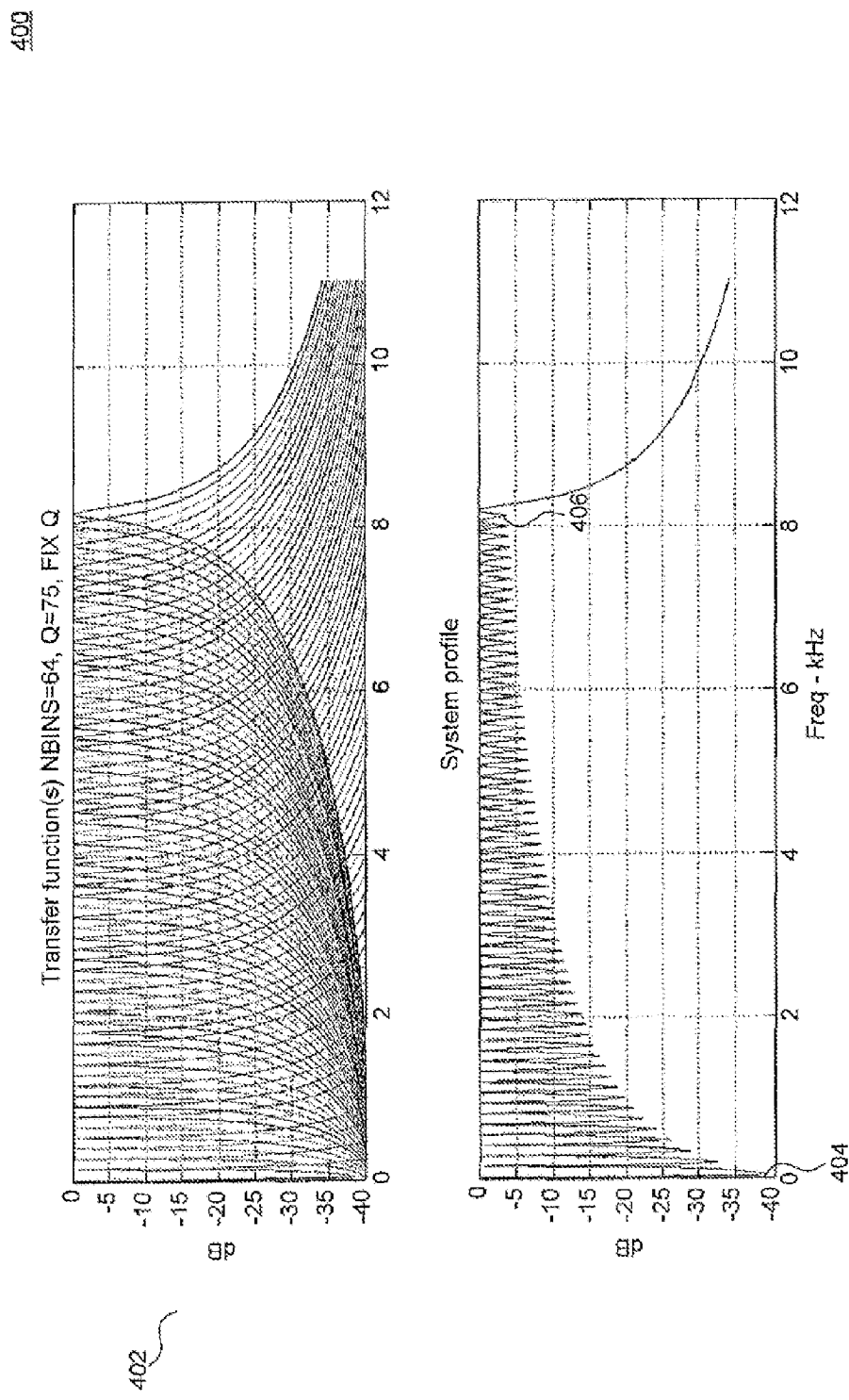
FIG. 4 illustrates filter bank ripple in an audio signal frequency band analysis, in accordance with an embodiment of the present invention.

FIG. 4 illustrates filter bank ripple in an audio signal frequency band analysis 400, in accordance with an embodiment of the present invention. Graph 402 illustrates the frequency response of 64 individual filters, linearly spaced across the frequency response range (corresponding to the audio signal frequency band of 20 Hz to 8 kHz) and having a constant Q-factor. As will be understood by one skilled in the relevant arts, additional computational power, in the form of adding linearly-spaced filters, can reduce ripple as shown in the example of frequency response 300 of FIG. 3. However, such additional computational power may not always be available, and as a result the 64 filters employed for signal analysis of audio signals in FIG. 4 result in significant attenuation, ranging from approximately −40 dB approaching 20 HZ to approximately −4 dB approaching 8 kHz.

III. Q-Factor Adjustment of Linearly Spaced Filters

Due to the complexity and computational costs of adding filters to filter bank 102 of FIG. 1 in order to reduce ripple, the effect of which is particularly pronounced the larger the filter bank's 102 frequency response range, it is desirable to implement a filter bank 102 that reduces ripple without the need to introduce additional filters. This is accomplished by making the Q-factor a monotonic increasing function (e.g., for all x and y such that x≤y, f(x)≤f(y)) of the filter center frequency, in accordance with an embodiment of the present invention.

Figure 5:
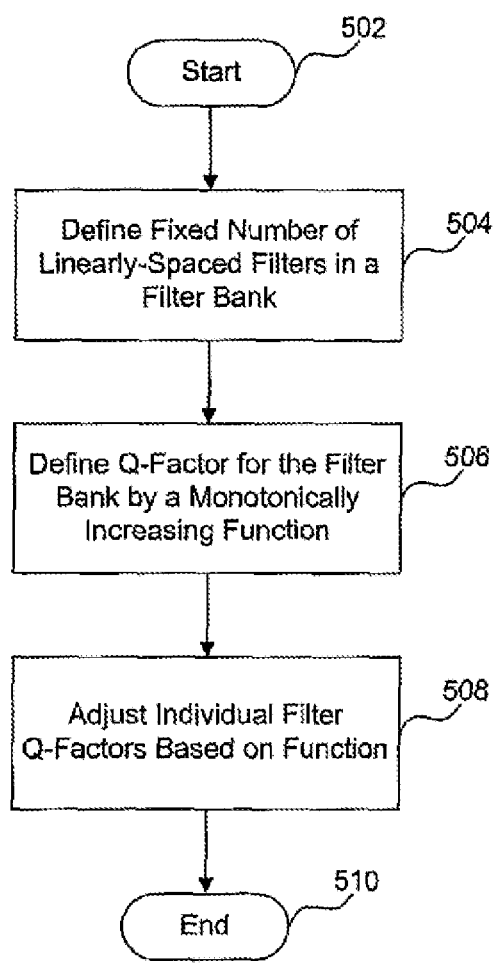
FIG. 5 is a flowchart illustrating steps by which to implement a filter bank having a reduced filter bank ripple, in accordance with an embodiment of the present invention.

FIG. 5 is a flowchart 500 illustrating steps by which to implement a filter bank, such as filter bank 102, having a reduced filter bank ripple, in accordance with an embodiment of the present invention. The method begins at step 502 and proceeds to step 504 where a fixed number of linearly-spaced filters is defined for a filter bank. In accordance with an embodiment of the present invention, filter bank 102 may be comprised of, by way of example and not limitation, 64 individual filters with their center frequencies linearly spaced over a frequency response range. For example, the 64 filters of audio signal frequency band analysis 400 of FIG. 4 may be used.

At step 506, a monotonically increasing function is defined over the filter bank for the Q-factor, in accordance with an embodiment of the present invention. One skilled in the relevant arts will appreciate that the precise nature of the formula depends on the application and the desire to emphasize certain frequency ranges. By way of example, and not limitation, the Q-factor function is a linear monotonically increasing function, although one skilled in the relevant arts will appreciate that the Q-factor function need not be limited to linear functions.

Based on this function, the Q-factor for each individual filter is resolved at step 508, dependent on the filter's center frequency, in accordance with an embodiment of the present invention. The resulting Q-factor is applied to the individual filter, and the method ends at step 510.

One skilled in the relevant arts will appreciate that the precise mechanism by which the Q-factor is applied to a filter depends on the nature of the configuration of the filter. By way of example, and not limitation, the filters of filter bank 102 of FIG. 1 are described in software or firmware, and their characteristics, such as then corresponding Q-factors, can be adjusted during development or run-time. In accordance with an additional embodiment of the present invention, the filters of filter bank 102 are comprised of discrete electronic components, with their Q-factors adjusted based on changing a characteristic of one or more of the discrete electronic components, either directly or using an input signal. One skilled in the relevant arts will appreciate that these adjustments may further depend on the type of filter being implemented, among additional factors, and the aforementioned examples are not limiting.

Figure 6:
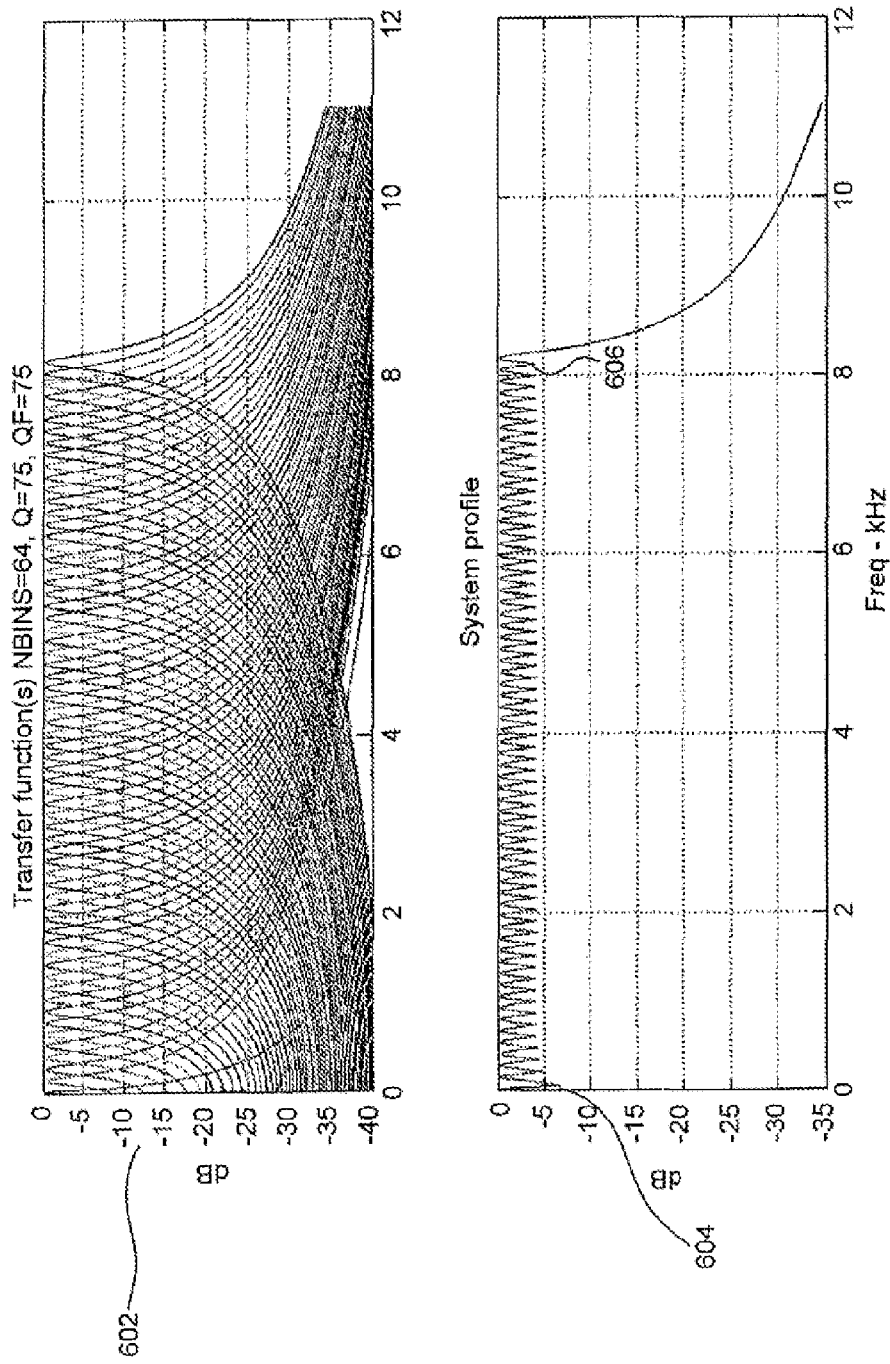
FIG. 6 illustrates reduced filter bank ripple in an audio signal frequency band analysis, in accordance with an embodiment of the present invention.

FIG. 6 illustrates reduced filter bank ripple in an audio signal frequency band analysis 600, in accordance with an embodiment of the present invention. Using the same number of filters as shown in FIG. 4, the Q-factor of each successive filter (e.g., filter 102a, filter 102b, etc.) is resolved by a monotonically increasing function, in accordance with a further embodiment of the present invention. As is shown, this results in an improved ripple ranging from approximately −6 dB approaching 20 Hz to approximately −4 dB approaching 8 kHz. The reduced attenuation across the frequency response range of the filter bank 102 using these adjusted Q-factors is a significant improvement over the approximately −40 dB attenuation approaching 20 Hz to approximately −4 dB approaching 8 kHz of the constant-Q filter bank of FIG. 4, and without the need to increase the number of sub-bands.

In accordance with an additional embodiment of the present invention, a constant ripple is provided by using a logarithmic frequency spacing for constant-Q filters of a filter bank 102. As a result, it is possible to improve the ripple response of a filter bank by either adjusting the Q-factors to conform to a monotonically increasing function in the case of a linearly-spaced filter bank, or by adjusting the filters to a logarithmic frequency spacing and maintaining a constant Q-factor across all filters.

IV. Application-Specific Improvements Using Q-Factor Adjustment

It is possible to use the variable Q filter design to support arbitrarily placed, overlapped, or disjoint arrays of filters, in accordance with an embodiment of the present invention. In a non-limiting exemplary embodiment, this comprises an array of infinite impulse response ("IIR") passband Hilbert filters used to provide instantaneous spectra energy and phase measurement on an input signal, such as the filters of filter bank 102 of FIG. 1. Rather than specifying the center frequency and bandwidth of the filters, it is possible to specify the 3 dB attenuation lower and upper cutoff frequencies, the filter order, and the filter type in order to provide desired spectral coverage using the minimum number of sub-band filters, in accordance with an embodiment of the present invention. This is accomplished through the use of filters with programmable cutoff frequencies, in accordance with an embodiment of the present invention. One skilled in the relevant arts will appreciate that other types of filters may be utilized in filter bank 102, and that the aforementioned filters are provided by way of example, and not limitation. In accordance with an embodiment of the present invention, a filter bank 102 configured in this manner resembles the characteristics of the basilar membrane ("BM"), a component of the cochlea.

Compared to finite impulse response ("FIR") filters, the structure of the aforementioned IIR filters corresponds better to the way the human cochlea works. When expressed on a logarithmic frequency scale, slopes of an IIR bandpass filter of a given filter order are independent of the chosen center frequencies, and therefore match the auditory frequency scale better than FIR filters. Additionally, movement of the BM, as with any oscillatory system, can be split into a magnitude of the maximal displacement of the BM as a function of time, and a phase describing instantaneous position or displacement, in accordance with an embodiment of the present invention. Phase is included due to its ability to be perceived by the cochlea to some degree and use in pitch perception and sound localization, as described in "Chimaeric sounds reveal dichotomies in auditory perception" to Smith et al. (*Nature* 416:87-90, March 2002).

Accordingly, the aforementioned configuration for filter bank 102 using IIR Hilbert passband filters results in a closer match to human auditory processing by providing phase information in addition to amplitude, in accordance with an embodiment of the present invention. However, as will be understood by one skilled in the relevant arts, the electronic cochlea described by filter bank configuration 100 is not limited to modeling the human ear, and can be used in other applications such as radar, sonar, and ultrasonic signal processing, by way of non-limiting example.

Figure 7:
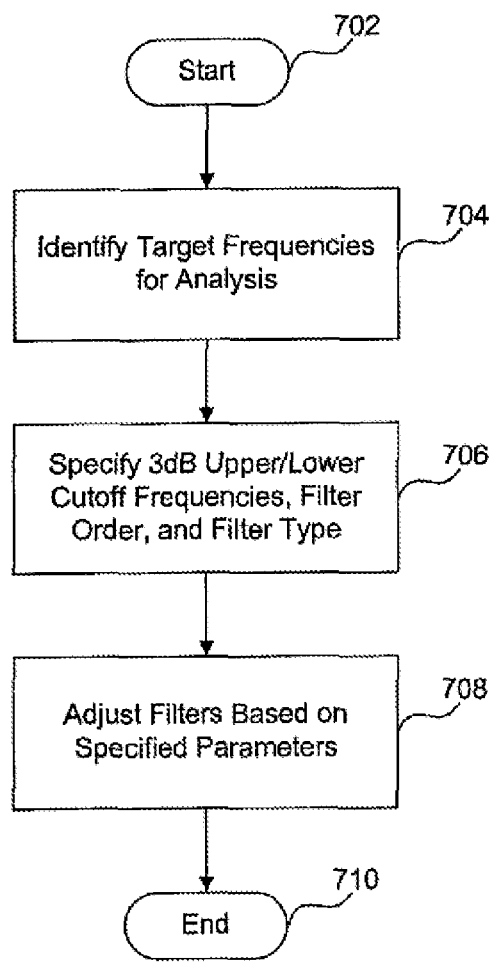
FIG. 7 is a flowchart illustrating steps by which to provide arbitrary frequency spacing using a variable Q filter design, in accordance with an embodiment of the present invention.

FIG. 7 is a flowchart 700 illustrating steps by which to provide arbitrary frequency spacing using a variable Q filter design, in accordance with an embodiment of the present invention. The method begins at step 702 and proceeds to step 704 where a target frequency or frequencies are identified for analysis, in accordance with an embodiment of the present invention. For example, in passive sonar applications for maritime use, it may be desirable to concentrate the filters, and reduce attenuation, around the 50 Hz and/or 60 Hz frequency ranges to aid in the detection of manned vessels. For other applications, the order of the filter (corresponding to the degree of attenuation for frequencies outside of a cutoff frequency) can be used to spread or cluster individual filters around a desired frequency or frequencies.

At step 706, the parameters used to adjust individual filters of filter bank 102 to target the identified frequencies are specified, including the 3 dB attenuation upper and lower cutoff frequencies, the filter order, and the filter type, in accordance with an embodiment of the present invention. These parameters are then applied to the filters at step 708, and the method ends at step 710.

Notably, the arbitrary placement of filters can be used in targeting desired frequencies, as discussed above, but also for doing so with fewer than all of the filters in filter bank 102, in accordance with an embodiment of the present invention. A disjoint array of filters, such as that obtained by disabling a subset of the filters of filter bank 102, and be used to, by way of example and not limitation, reduce processing complexity for analysis of a frequency range that does not require the use of all filters of filter bank 102 to obtain an output with an acceptable ripple.

V. Signal Characteristic-Dependent Signal Enhancements

As previously noted, the output of each of filters 102 is an instantaneous energy measure and a phase, in accordance with an embodiment of the present invention. As the instantaneous energy reading provided by each filter 102a-102n may fluctuate dramatically at any particular moment, the quickness or slowness with which the output provided by the filters 102 to such a fluctuation can be used to enhance certain characteristics of the signal.

This enhancement is accomplished through the use of ARMA 104, in accordance with an embodiment of the present invention. Each ARMA 104 outputs an autoregressive moving average for its corresponding filter 102, allowing for adjustments in filter response to any particular stimulus. One skilled in the relevant arts will appreciate that implementations of ARMA 104, as applied to the general case, are sufficiently well-understood and can be readily applied to the computation of an ARMA for the instantaneous energy output of filters 102.

Figure 8:
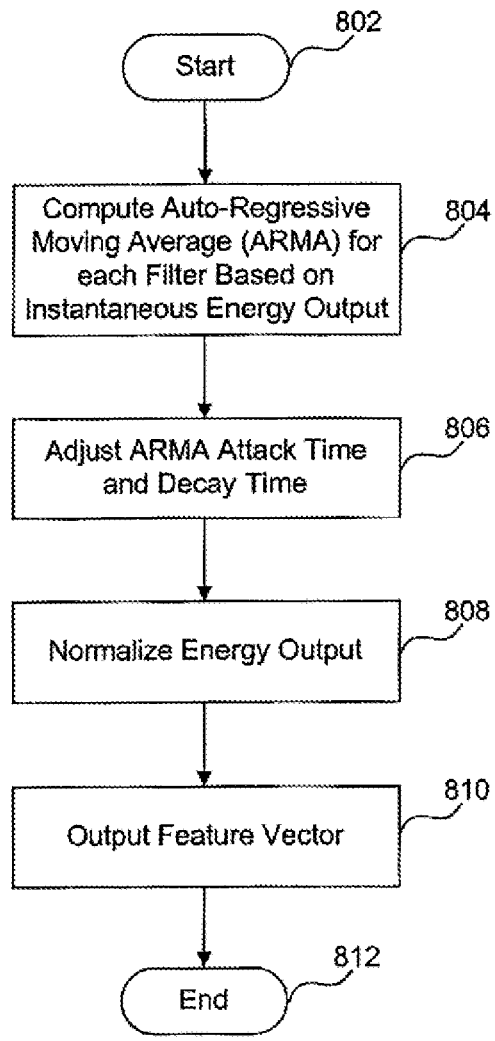
FIG. 8 is a flowchart illustrating steps by which a signal can be enhanced through the use of an autoregressive moving average, in accordance with an embodiment of the present invention.

FIG. 8 is a flowchart 800 illustrating steps by which a signal can be enhanced through the use of ARMA 104, in accordance with an embodiment of the present invention. The method begins at step 802 and proceeds to step 804 where ARMA 104 is computed for each filter 102 based on that filter's instantaneous energy output, in accordance with an embodiment of the present invention. By way of example, and not limitation, filter 102a has an associated sample rate, and ARMA 104a, corresponding to filter 102a, maintains an autoregressive moving average for some number N of prior samples.

At step 806, parameters for computing ARMA 104 are adjusted, in accordance with an embodiment of the present invention. These parameters can affect, for example, the attack time and decay time of the ARMA 104. By way of example, and not limitation, ARMA 104a may be adjusted so that the attack time (i.e., how quickly the average energy output from ARMA 104a is adjusted when the instantaneous energy output of filter 102a is higher than the average energy output) is shorter than the decay time (i.e., how quickly the average energy output from ARMA 104a is adjusted when the instantaneous energy output of filter 102a is lower than the average energy output).

In accordance with an embodiment of the present invention, the average energy output produced by ARMA 104 is normalized by normalizers 106. This is useful in, for example, constraining the energy outputs to a particular range of values, such as −1 to 1, for use in subsequent processing. These normalized results are then output at step 810 as a feature vector, the feature vector having a number of bins corresponding to each normalized value, in accordance with an embodiment of the present invention. The method then ends at step 812.

Adjustments to ARMA 104 allow, for example, the dampening of sudden, abrupt, and temporally-constrained noises by lengthening the attack time, requiring prolonged high energy inputs from filters 102 to affect the average energy output from ARMA 104. In an alternative non-limiting exemplary application, adjustments to ARMA 104 allow for sounds that require further analysis or attention to attenuate more gradually than they would otherwise by lengthening the decay time, allowing a sudden, abrupt, and temporally-constrained sound to linger as an output in the average energy output from ARMA 104. One skilled in the relevant arts will further recognize that these techniques can be applied to each individual ARMA 104a-104n, allowing different applications for different frequency sub-bands.

Figure 9:
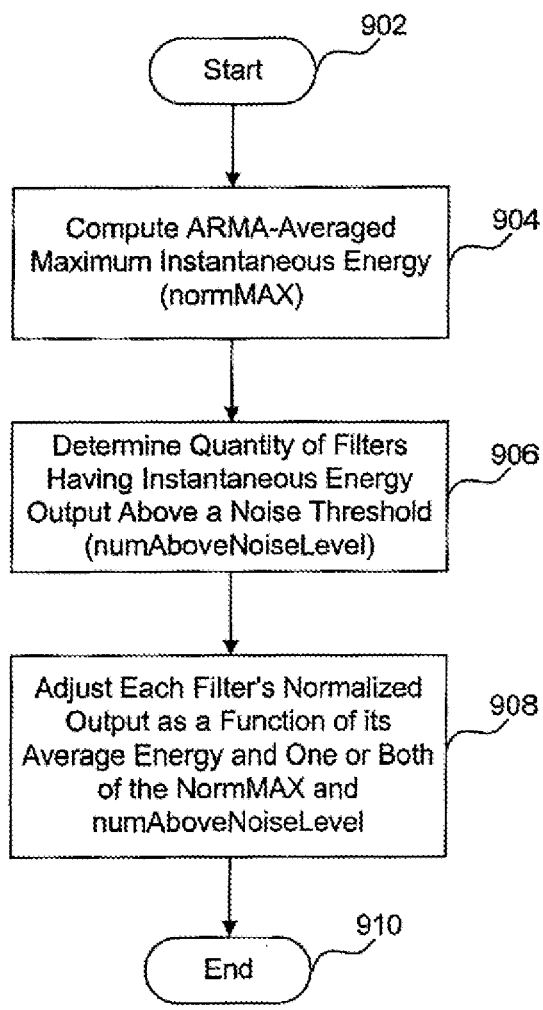
FIG. 9 is a flowchart illustrating steps by which amplification or clamping of individual energy outputs can be accomplished based on characteristics of an input signal under analysis, in accordance with an embodiment of the present invention.

An additional enhancement allows for further feature extraction through the use of adjustments to normalizers 106, in accordance with an embodiment of the present invention. FIG. 9 is a flowchart 900 illustrating steps by which amplification or clamping of individual energy outputs can be accomplished based on characteristics of an input signal under analysis, in accordance with an embodiment of the present invention. The method begins at step 902 and proceeds to step 904 where a maximum instantaneous energy value (108 of FIG. 1) is obtained from all of the instantaneous energy outputs of filters 102. This maximum instantaneous energy value is averaged using ARMA filter 110, in accordance with an embodiment of the present invention, producing a normalized maximum instantaneous energy value (termed "normMax").

At step 906, a quantity of filters 102 having an instantaneous energy output above some noise threshold is determined (termed "numAboveNoiseLevel") for each sampling clock cycle, in accordance with an embodiment of the present invention. For example, a strong frequency response from narrow-band filter 102c, with a weak response from the remaining filters 102 below the noise threshold, would result in a numAboveNoiseLevel equal to '1'. In accordance with an embodiment of the present invention, the noise threshold can be predefined, manually adjusted, or automatically adjusted based on a characteristic of the input signal using techniques that will become apparent to one skilled in the relevant arts.

At step 908, each normalized output from normalizers 106 is computed as a function of the average energy from corresponding ARMA 104 (e.g., output of normalizer 106a is computed as a function of the average energy output produced by ARMA 104a), the normalized maximum instantaneous energy value normMax, and the number of filters having an instantaneous energy output above the noise threshold numAboveNoiseLevel, in accordance with an embodiment of the present invention. The method then ends at step 910.

By way of example, and not limitation, a non-linear function 114 of FIG. 1 divides the average energy received by a normalizer 106 by the normMax value, multiplied by a monotonic function of the corresponding filter bin's central frequency (i.e., the central frequency of the filter, such as filter 102a, corresponding to the instant normalizer, such as normalizer 106a). The output of this function, alpha, is used to amplify or clamp normalizer 106 outputs, in accordance with an embodiment of the present invention.

In a further example, for each normalizer 106 whose average energy input from corresponding ARMA 104 is below a threshold, which may be adjustable in an embodiment, and if alpha is below a certain threshold, the normalized energy output by normalizer 106 is boosted by monotonic function alpha.

In accordance with an additional embodiment of the present invention, the feature vector output comprised of normalized energy outputs from normalizers 106 can then be analyzed to detect characteristics in the source input having the benefit of the aforementioned enhancements. In accordance with a further embodiment of the present invention, it is possible to take first- and second-derivatives of, or perform other mathematical functions on, these feature vectors, in order to, for example, obtain velocity or acceleration (respectively) of the value changes of the feature vector output. This data can be used to facilitate, for example, speaker recognition, although one skilled in the relevant arts will appreciate and recognize that a number of applications for these enhanced feature vectors exist.

In accordance with a further embodiment of the present invention, the output of normalizers 106 is provided to a neural network used in noise cleanup. One skilled in the relevant arts will appreciate that such use of neural networks may be attached to any output of exemplary filter bank configuration 100, and use to perform noise cleanup on the output of normalizers 106 is provided by way of example, and not limitation. An exemplary non-limiting neural network used in noise cleanup is disclosed in co-pending, commonly-owned U.S. patent application Ser. No. 12/883,313, filed Sep. 16, 2010, entitled "Noise Cleanup", which is incorporated herein by reference in its entirety.

VI. Computational Load of the Electronic Cochlea

Figure 10:
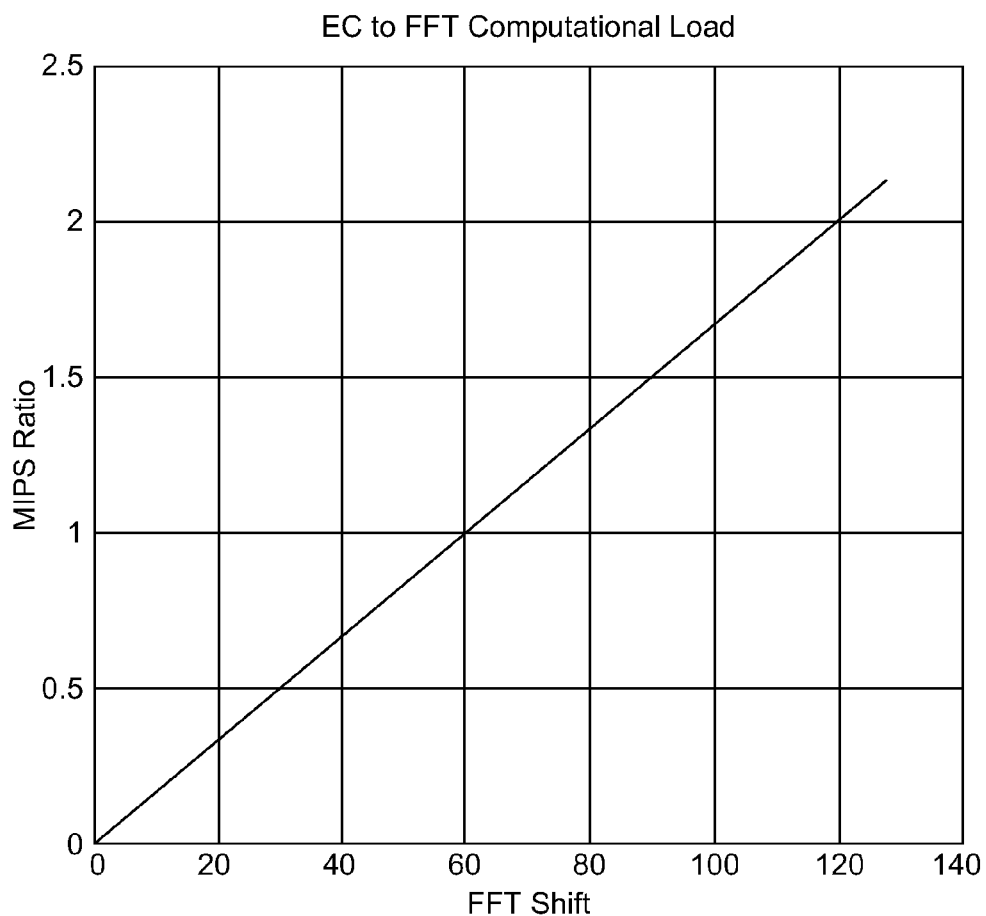
FIG. 10 is a graph illustrating the ratio of processing demands of the electronic cochlea to that of an STFT implementation as a function of FFT window shift, in accordance with an embodiment of the present invention.

FIG. 10 is a graph 1000 illustrating the ratio of processing demands of the electronic cochlea to that of an STFT implementation, as a function of FFT window shift (i.e., window size minus overlap), in accordance with an embodiment of the present invention. Graph 1000 depicts computational load 1002 as a ratio between processing demands of the electronic cochlea to STFT processing ("MIPS ratio"). The MIPS ratio is shown as a function of the FFT window shift 1004. The exemplary non-limiting computational load illustrated by graph 1000 is based on a filter bank configuration 100 having a sampling frequency of 44.1 kHz, uniform frequency coverage from 50 Hz to 3 kHz, frequency spacing of 10 Hz, and a filter order of 2, in accordance with an embodiment of the present invention. The electronic cochlea is configured with 296 frequency bins, and the FFT size is 8192, in accordance with a further embodiment of the present invention.

In STFT processing, the window size is the size of a segment of data used to calculate each frame, and determines the basic frequency resolution of a resulting spectrogram. While smaller segment sizes give more detailed time resolution, this is at the expense of frequency resolution. The number of segments overlapping a point ("overlap") determines the time resolution of the resulting spectrogram, with larger overlaps resulting in better resolution of the time domain, while requiring additional computations.

In contrast, the computational load of the electronic cochlea depends on the frequency coverage, sampling frequency, number of frequency bins, and the order of each filter of filter bank configuration 100, in accordance with an embodiment of the present invention.

One skilled in the relevant arts will recognize that many FFT algorithms exist with different operation counts, such that the computational load shown in graph 1000 is not exact but rather an order of magnitude estimate. Additionally, the electronic cochlea based on filter bank configuration 100 depicted in graph 1000 is assumed to be uniformly spaced, in accordance with an embodiment of the present invention. However, logarithmic spacing, which is available in the electronic cochlea but not for FFTs, would further reduce the computational load of the electronic cochlea, in accordance with a further embodiment of the present invention.

VII. Example Computer System Implementation

Figure 11:
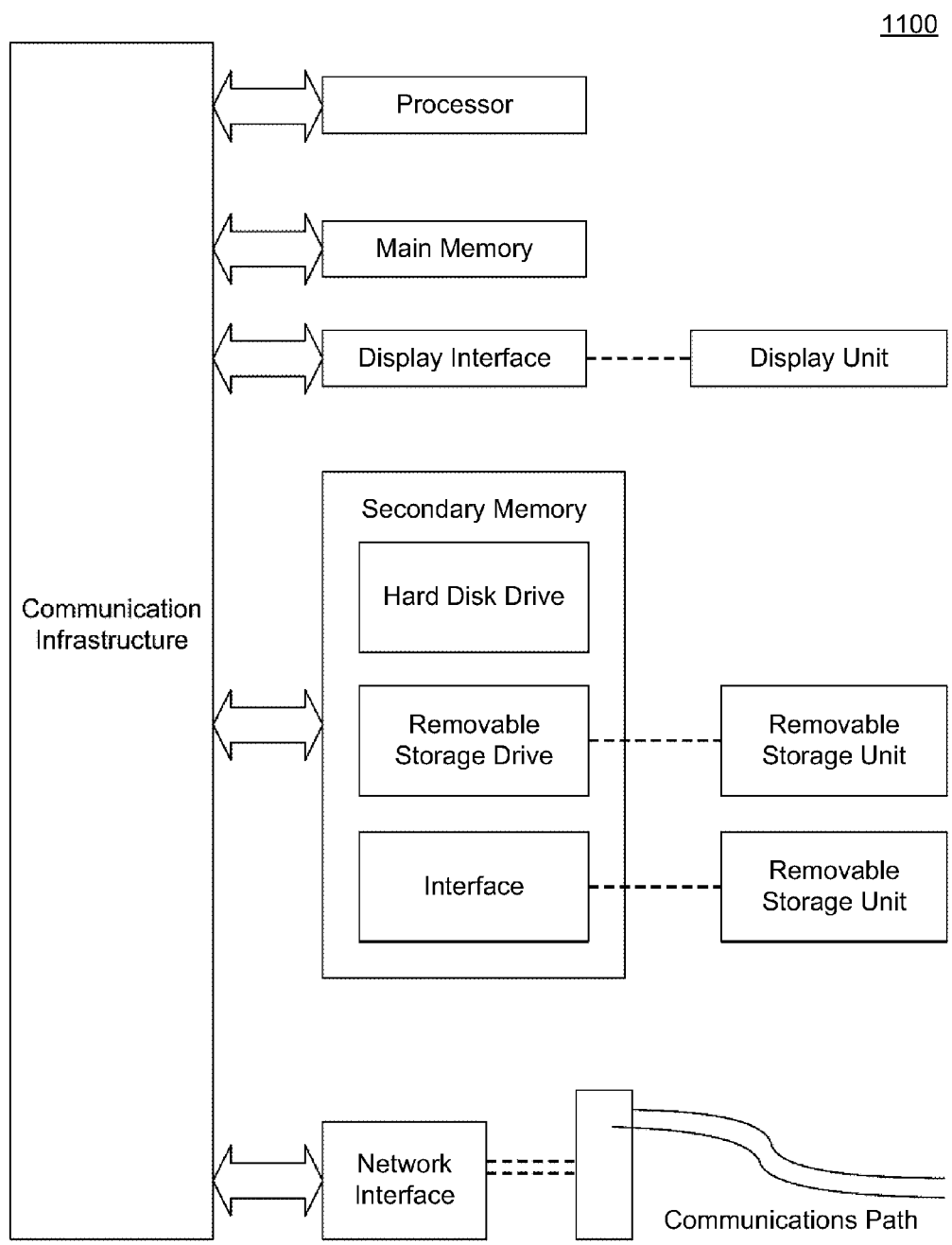
FIG. 11 depicts an example computer system in which embodiments of the present invention may be implemented.

Various aspects of the present invention can be implemented by software, firmware, hardware, or a combination thereof FIG. 11 illustrates an example computer system 1100 in which the present invention, or portions thereof, can be implemented as computer-readable code. For example, the methods illustrated by flowcharts 500 of FIG. 5, 700 of FIG. 7, 800 of FIGS. 8, and 900 of FIG. 9, can be implemented in system 1100. Various embodiments of the invention are described in terms of this example computer system 1100. After reading this description, it will become apparent to a person skilled in the relevant art how to implement the invention using other computer systems and/or computer architectures.

Computer system 1100 includes one or more processors, such as processor 1104. Processor 1104 can be a special purpose or a general purpose processor. Processor 1104 is connected to a communication infrastructure 1106 (for example, a bus or network).

Computer system 1100 also includes a main memory 1108, preferably random access memory (RAM), and may also include a secondary memory 1110. Secondary memory 1110 may include, for example, a hard disk drive 1112, a removable storage drive 1114, and/or a memory stick. Removable storage drive 1114 may comprise a floppy disk drive, a magnetic tape drive, an optical disk drive, a flash memory, or the like. The removable storage drive 1114 reads from and/or writes to a removable storage unit 1118 in a well known manner. Removable storage unit 1118 may comprise a floppy disk, magnetic tape, optical disk, etc. that is read by and written to by removable storage drive 1114. As will be appreciated by persons skilled in the relevant art(s), removable storage unit 1118 includes a computer usable storage medium having stored therein computer software and/or data.

In alternative implementations, secondary memory 1110 may include other similar means for allowing computer programs or other instructions to be loaded into computer system 1100. Such means may include, for example, a removable storage unit 1122 and an interface 1120. Examples of such means may include a program cartridge and cartridge interface (such as that found in video game devices), a removable memory chip (such as an EPROM, or PROM) and associated socket, and other removable storage units 1122 and interfaces 1120 that allow software and data to be transferred from the removable storage unit 1122 to computer system 1100.

Computer system 1100 may also include a communications interface 1124. Communications interface 1124 allows software and data to be transferred between computer system 1100 and external devices. Communications interface 1124 may include a modem, a network interface (such as an Ethernet card), a communications port, a PCMCIA slot and card, or the like. Software and data transferred via communications interface 1124 are in the form of signals that may be electronic, electromagnetic, optical, or other signals capable of being received by communications interface 1124. These signals are provided to communications interface 1124 via a communications path 1126. Communications path 1126 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 1118, removable storage unit 1122, and a hard disk installed in hard disk drive 1112. Signals carried over communications path 1126 can also embody the logic described herein. Computer program medium and computer usable medium can also refer to memories, such as main memory 1108 and secondary memory 1110, which can be memory semiconductors (e.g. DRAMs, etc.). These computer program products are means for providing software to computer system 1100.

Computer programs (also called computer control logic) are stored in main memory 1108 and/or secondary memory 1110. Computer programs may also be received via communications interface 1124. Such computer programs, when executed, enable computer system 1100 to implement the present invention as discussed herein. In particular, the computer programs, when executed, enable processor 1104 to implement the processes of the present invention, such as the steps in the methods illustrated by flowcharts 500 of FIG. 5, 700 of FIG. 7, 800 of FIGS. 8, and 900 of FIG. 9, discussed above. Accordingly, such computer programs represent controllers of the computer system 1100. Where the invention is implemented using software, the software may be stored in a computer program product and loaded into computer system 1100 using removable storage drive 1114, interface 1120, hard drive 1112 or communications interface 1124.

The invention is also directed to computer program products comprising software stored on any computer useable medium. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

VIII. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. It should be understood that the invention is not limited to these examples. The invention is applicable to any elements operating as described herein. Accordingly, the breadth and scope of the present invention should not be limited by any of the above-described exemplary embodiments, but should be defined only in accordance with the following claims and their equivalents.

What is claimed is:

1. A computer-implemented method for reducing ripple of a filter bank, the method being implemented in a computer system that includes one or more physical processors and physical storage, the method comprising:
   determining a number of filters that jointly form a filter bank;
   implementing, by the one or more physical processors, the determined number of filters, wherein individual filters are characterized by a center frequency and a bandwidth;
   determining, by the one or more physical processors, Q-factors for the filters, wherein individual Q-factors are determined based on a ratio of the center frequency and the bandwidth;
   adjusting, by the one or more physical processors, the center frequencies of the filters in the filter bank such that the filters are linearly-spaced filters;
   obtaining a monotonically increasing Q-factor function for the filter bank; and
   applying individual Q-factor adjustments to the individual filters based on the Q-factor function, by adjusting individual bandwidths such that corresponding individual Q-factors accord with the Q-factor function.

2. The method of claim 1, wherein the filters in the tilter bank are infinite impulse response passband Hilbert filters.

3. The method of claim 1, further comprising:
   identifying a target frequency range for filter bank operation,
   wherein adjusting the center frequencies of the filters in the filter bank is performed such that the bandwidths of the filters cover the target frequency range.

4. The method of claim 1, wherein individual filters include an instantaneous energy output, the method further comprising:
   applying an auto-regressive moving average to the instantaneous energy output of the individual filters in the filter bank.

5. The method of claim 4, wherein the auto-regressive moving average for individual filters is characterized by attack and decay times, the method further comprising:
   adjusting the auto-regressive moving average attack and decay times for the individual filters in the filter bank.

6. The method of claim 4, further comprising:
   computing, per individual filter, a maximum instantaneous energy based on the auto-regressive moving average of the instantaneous energy output;
   determining a subset of filters in the filter bank having the maximum instantaneous energy above a noise threshold; and
   adjusting a normalized output for the subset of filters in the filter bank having the maximum instantaneous energy above the noise threshold.

7. The method of claim 1, further comprising:
   normalizing an instantaneous energy output of the individual filters in the filter bank; and
   outputting the normalized instantaneous energy output of the filters as a feature vector having a dimensionality of the number of filters.

8. A computer system for reducing ripple of a filter bank, the system comprising:
   one or more physical processors; and
   physical storage,
   the one or more physical processors and physical storage being configured to implement:
      a filter bank comprising a number of filters that jointly form the filter bank, wherein individual filters are characterized by a center frequency and a bandwidth, wherein the center-frequencies of the filters in the filter bank are adjusted such that the filters are linearly-spaced filters;
      a defining module configured to define Q-factors for the filters, wherein individual O-factors are determined based on a ratio of the center frequency and the bandwidth, and wherein the defining module is further configured to obtain a monotonically increasing Q-factor function for the filter bank; and
      a Q-factor adjustment module configured to apply individual Q-factor adjustments to the individual filters based on the Q-factor function, by adjusting individual bandwidths such that corresponding individual Q-factors accord with the Q-factor function.

9. The system of claim 8, wherein the filters in the filter bank are infinite impulse response passband Hilbert filters.

10. The system of claim 8, wherein the filters in the filter bank are implemented such that the bandwidths of the filters cover a target frequency range.

11. The system of claim 8, wherein individual filters include an instantaneous energy output, and wherein the one or more physical processors and physical storage are further being configured to implement:
   an auto-regressive moving average module configured to apply an auto-regressive moving average to the instantaneous energy output of the individual filters in the filter bank.

12. The system of claim 11, wherein the auto-regressive moving average for individual filters is characterized by attack and decay times, and wherein the auto-regressive moving average module is further configured to adjust the auto-regressive moving average attack and decay times for the individual filters in the filter bank.

13. The system of claim 11, wherein the one or more physical processors and physical storage are further being configured to implement:
   a computing module configured to compute, per individual filter, a maximum instantaneous energy based on the auto-regressive moving average of the instantaneous energy output;
   a determining module configured to determine a subset of filters in the filter bank having the maximum instantaneous energy above a noise threshold; and
   an adjusting module configured to adjust a normalized output for the subset of filters in the filter bank having the maximum instantaneous energy above the noise threshold.

14. The system of claim 8, wherein the one or more physical processors and physical storage are further being configured to implement:
   a normalizer configured to normalize an instantaneous energy output of the individual filters in the filter bank and to output the normalized instantaneous energy output of the filters as a feature vector having a dimensionality of the number of filters.

* * * * *